United States Patent [19]
Yoshida et al.

[11] Patent Number: 5,213,877
[45] Date of Patent: May 25, 1993

[54] CERAMIC SUBSTRATE USED FOR FABRICATING ELECTRIC OR ELECTRONIC CIRCUIT

[75] Inventors: Hideaki Yoshida; Makoto Toriumi; Hirokazu Tanaka; Masao Umezawa; Michio Yuzawa; Yoshirou Kuromitsu, all of Saitama, Japan

[73] Assignee: Mitsubishi Materials Corporation, Tokyo, Japan

[21] Appl. No.: 694,715

[22] Filed: May 2, 1991

[51] Int. Cl.$^5$ .............................................. B32B 9/00
[52] U.S. Cl. ..................................... 428/209; 428/210; 428/901; 228/121; 257/750
[58] Field of Search ................. 228/121; 428/209, 210, 428/901; 357/71

[56] References Cited

U.S. PATENT DOCUMENTS

| | | | |
|---|---|---|---|
| 3,927,815 | 12/1975 | Mase et al. | 228/121 |
| 4,672,739 | 6/1987 | Churchwell et al. | 29/589 |
| 4,781,970 | 11/1988 | Barbee et al. | 428/210 |
| 4,979,015 | 12/1990 | Stierman et al. | 357/69 |

FOREIGN PATENT DOCUMENTS 0097944 1/1984 European Pat. Off. .

OTHER PUBLICATIONS

Patent Abstracts Of Japan, vol. 13, No. 186 (E-752) May 2, 1989 and JP-A 01 012 559 (Toshiba).
Patent Abstracts Of Japan, vol. 12, No. 54 (E-583) Feb. 18, 1988 and JP-A 62 199 038 (Hitachi Ltd.).
Patent Abstracts Of Japan, vol. 14, No. 90 (C-691) Feb. 20, 1990 and JP-A 01 301 575 (Kyocera Corp).
Patent Abstracts Of Japan, vol. 14, No. 292 (E-944) Jun. 25 1990 and JP-A 02 094 652 (Mitsubishi Metal Corp.).
Patent Abstracts Of Japan, vol. 13, No. 166 (E-746) Apr. 20 1989 and JP-A 63 318 760 (Sumitomo Electric Ind. Ltd).
Patent Abstracts Of Japan, vol. 13, No. 396 (E-815) Sep. 4 1989 and JP-A 01 140 693 (Fujitsu Ltd.).

*Primary Examiner*—Patrick J. Ryan
*Assistant Examiner*—Cathy Lee
*Attorney, Agent, or Firm*—Sughrue, Mion, Zinn, Macpeak & Seas

[57] ABSTRACT

A ceramic substrate is used for an electric or electronic circuit, and comprises a ceramic foundation and at least one conductive island formed of aluminum or an aluminum alloy and bonded to one surface of the ceramic foundation for providing conductive paths to circuit components connected thereto, wherein the aluminum or aluminum-alloy island is brazed to the ceramic foundation with a brazing alloy selected from the group consisting of aluminum-silicon alloy, aluminum-germanium alloy, aluminum-silicon-magnesium alloy and aluminum-silicon-germanium alloy so that thermal stress between the ceramic foundation and the conductive island is taken up.

9 Claims, 5 Drawing Sheets

CERAMIC SUBSTRATE USED FOR FABRICATING ELECTRIC OR ELECTRONIC CIRCUIT

FIELD OF THE INVENTION

This invention relates to a ceramic substrate used for an electric or electronic circuit and, more particularly, to a conductive island mounted on a ceramic plate.

BACKGROUND OF THE INVENTION

A typical example of the ceramic substrate is illustrated in FIG. 1 and comprises a ceramic plate 1 of aluminum oxide sandwiched between two copper plates 2 and 3, and a heat sink 4 of copper. The copper plates 2 and 3 are bonded to both surfaces of the ceramic plate 1 through a liquid phase bonding phenomenon. Namely, the bonding surfaces of the copper plates 2 and 3 are firstly oxidized, and the ceramic plate 1 is laminated with the copper plates 2 and 3 on both surfaces thereof. While the ceramic plate laminated with the copper plates 2 and 3 are heated at 1065 to 1085 degrees in centigrade, the copper and the copper oxide are melted, and the copper plates 2 and 3 are bonded to the ceramic plate 1 through a copper-and-copper oxide eutectic phenomenon. One of the copper plates 2 and 3 provides a conduction path between circuit components, and the other is soldered to the heat sink member 4 at lower than 450 degrees in centigrade.

A problem inherent in the prior art ceramic substrate is a small resistance against stress of thermal fatigue. When the electric or electronic circuit is activated for a task, a large amount of heat is produced in the circuit components, and the ceramic substrate conducts the heat for radiating. Since the copper plates 2 and 3 are different in thermal expansion coefficient from the ceramic plate 1, the ceramic plate is subjected to thermal stress. Upon being inactivated, no heat takes place, and the ceramic plate is released from the thermal stress. Thus, heat cycle takes place in the electric or electronic circuit. Since the aluminum oxide plate 1 and the copper plates 2 and 3 are rigidly coupled through the copper-and-copper oxide eutectic phenomenon, the ceramic substrate is repeatedly subjected to the thermal stress. The thermal stress is causative of cracks in the ceramic plate 1, and the ceramic substrate is broken in the worst case.

SUMMARY OF THE INVENTION

It is an important object of the present invention to provide a ceramic substrate which is large in resistance against the repetition of thermal stress.

To accomplish the object, the present invention proposes to form conductive islands of aluminum or an aluminum alloy which are brazed to a ceramic foundation with an aluminum alloy.

In accordance with the present invention, there is provided a ceramic substrate for an electric or electronic comprising a) a ceramic foundation, and b) conductive island means bonded to one surface of the ceramic foundation and providing a conductive path for at least one circuit component connected thereto, characterized in that the conductive island means is brazed to the one surface of the ceramic foundation with a brazing alloy selected from the group consisting of an aluminum-silicon alloy, an aluminum-germanium alloy, an aluminum-silicon magnesium alloy and an aluminum-silicon-germanium alloy.

BRIEF DESCRIPTION OF THE DRAWINGS

The features and advantages of a ceramic substrate according to the present invention will be more clearly understood from the following description taken in conjunction with the accompanying drawings in which.

DESCRIPTION OF THE PREFERRED EMBODIMENTS

First Embodiment

Figure 1:
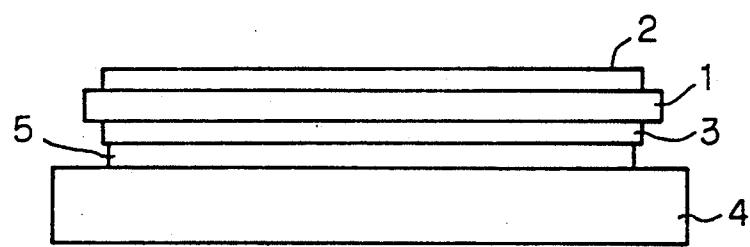
FIG. 1 is a side view showing the structure of the prior art ceramic substrate.
Figure 2:
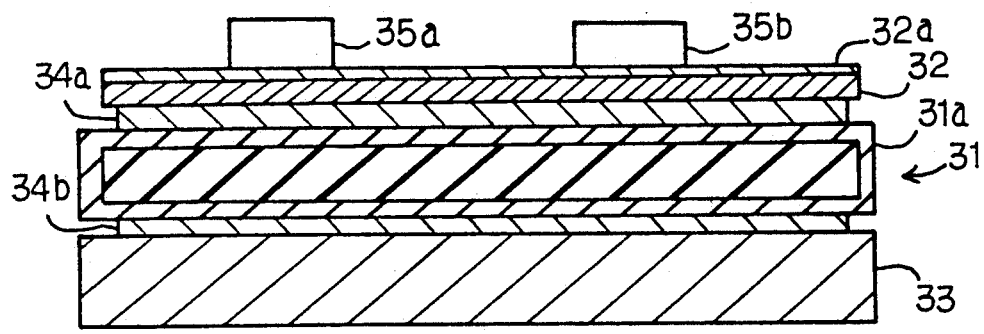
FIG. 2 is a cross sectional view showing the structure of a ceramic substrate according to the present invention.

Referring first to FIG. 2 of the drawings, a ceramic substrate used for forming a thick film circuit comprises a ceramic plate 31 covered with an aluminum oxide film 31a, a metallic island pattern 32, a metallic heat sink 33, and brazing alloy blocks 34a and 34b. The ceramic plate 31 is essentially composed of aluminum nitride, and the ceramic plate 31 is produced through a sintering process on powder of aluminum nitride. However, the ceramic substrate may contain sintering aids such as yttrium oxide ($Y_2O_3$) and/or calcium oxide (CaO), and the sintering aids enhance the sintered density and, accordingly, the strength of the ceramic plate 31. Yttrium oxide and/or calcium oxide serves as a kind of sintering aids from the aspect of the sintering process; however, they further promote the growth of the aluminum oxide film 31a, and, accordingly, serve as oxidizers as described in detail hereinbelow.

In this instance, the sintering aids are mixed into the powder of aluminum nitride before the sintering. Since the aluminum oxide film 31a is grown through oxidation of the ceramic plate 31, the sintering aids further promote the oxidation of the surface portion of the ceramic plate 31, and, for this reason, the aluminum oxide film 31a becomes dense. The sintering aids range from about 0.1% to about 10% by weight, and the average thickness of the aluminum oxide film 31a is between about 0.2 micron and about 20 microns.

If the sintering aids are less than 0.1% by weight, any high-density sintered aluminum nitride is hardly achieved, and such a small amount of sintering aids hardly promote the oxidation of the surface portion of the ceramic plate 31. The sintering aids greater than about 10% by weight are not desirable, because such a large amount of the sintering aids decrease the heat conductivity of the ceramic plate 31. If the aluminum oxide film 31a is less than about 0.2 micron thick, such an extremely thin aluminum oxide film decreases the adhesion between the ceramic plate 31 and the brazing alloy blocks 34a and 34b. An aluminum oxide film greater than about 20 microns deteriorates the heat conductivity of the ceramic plate 31.

The sintered aluminum nitride plate 31 is subjected to a surface roughening in a water solution of acid before formation of the aluminum oxide film 31a. The water solution of acid contains hydrofluoric acid (HF) or ammonium fluoride (HF-NH$_3$) ranging from about 3% to about 10% at 15 degrees to 30 degrees in centigrade. The surface roughening may be carried out in an alkaline water solution, and the alkaline water solution may contain sodium hydroxide (NaOH) or potassium hydroxide (KOH) ranging from about 3% to about 10% at 30 to 90 degrees in centigrade. The surface roughening achieves 1.6 S degree to 25 S degree of JIS (Japanese Industrial Standards) surface roughness, and the sintered aluminum nitride plate is, then, placed in an oxidizing ambience. The oxidizing ambience has a partial pressure of oxygen ranging from $10^{-2}$ to 1 atm, and a partial pressure of water vapor of about $10^{-3}$ atm at 1100 degrees to 1500 degrees in centigrade. In the oxidizing ambience the sintered aluminum nitride plate is kept for a predetermined time period, and the aluminum oxide film 31a is grown to the aforementioned thickness range. The metallic island pattern 32 is covered with a thin conductive film 32a of, for example, copper or nickel, and circuit components 35a and 35b are mounted on the thin conductive film 32a.

Description is hereinbelow made on a process sequence for fabricating the ceramic substrate shown in FIG. 2. The process sequence starts with preparation of ingredient powders, i.e., powder of aluminum nitride, powder of yttrium oxide (Y$_2$O$_3$) and powder of calcium oxide (CaO), and the ingredient powders are 1 micron to 3 micron in average grain size.

The ingredient powders are regulated to respective compositions shown in Table 1, and are mixed in a wet ball-mill for about 72 hours, then being dried. An organic binder is added to and mixed into the resultant mixtures, and green sheets are formed by using a doctor-blading technique. The green sheets are sintered in nitrogen ambience of atmospheric pressure at 1800 degrees in centigrade for two hours, and the sintered products are substantially identical in composition with the respective mixtures. Each of the sintered products is 50 millimeter in width, 75 millimeter in length and 0.63 millimeter in thickness. The sintered products are dipped in an alkaline water solution containing 7% of NaOH at 60 degrees in centigrade for 30 to 40 minutes. The surface roughness of 6.3 S degree to 12.5 S degree in the JIS is achieved through the surface roughening. The sintered products are, then, oxidized at oxygen partial pressure of 0.1 atm to 1 atm as well as water vapor pressure of $1 \times 10^{-5}$ and $1 \times 10^{-3}$ atm, and the oxidation is carried out at 1350 degrees to 1450 degrees in centigrade. Aluminum oxide films are grown on the respective sintered products, and the thickness of each aluminum oxide film is described in Table 2. The sintered products each covered with the aluminum oxide film are hereinbelow referred to as ceramic plates.

For comparing usage, a prior art ceramic substrate is prepared, and the prior art ceramic substrate has a ceramic plate formed of aluminum oxide (Al$_2$O$_3$) with purity of 96%. The ceramic plate of aluminum oxide has the same dimensions as the sintered products according to the present invention.

TABLE 1

| Specimen | Ceramic Plate Composition (WT %) | | | Al$_2$O$_3$ film thickness (micron) |
|---|---|---|---|---|
| | Y$_2$O$_3$ | CaO | AlN | |
| 1 | 0.1 | — | residue | 0.5 |
| 2 | 0.5 | — | residue | 3.2 |
| 3 | 1.5 | — | residue | 14.3 |
| 4 | 2.5 | — | residue | 5.8 |
| 5 | 5.0 | — | residue | 4.0 |
| 6 | 7.0 | — | residue | 0.2 |
| 7 | 9.0 | — | residue | 1.2 |
| 8 | 10.0 | — | residue | 11.3 |
| 9 | — | 0.1 | residue | 6.2 |
| 10 | — | 1.0 | residue | 2.4 |
| 11 | — | 2.5 | residue | 0.5 |
| 12 | — | 4.0 | residue | 10.2 |
| 13 | — | 5.0 | residue | 1.3 |
| 14 | — | 6.5 | residue | 7.8 |
| 15 | — | 8.0 | residue | 12.6 |
| 16 | — | 9.5 | residue | 4.3 |
| 17 | 0.1 | 0.1 | residue | 0.3 |
| 18 | 1.0 | 1.0 | residue | 2.3 |
| 19 | 0.5 | 2.0 | residue | 15.4 |
| 20 | 3.0 | 1.0 | residue | 5.2 |
| 21 | 4.0 | 2.0 | residue | 8.8 |
| 22 | 3.0 | 5.0 | residue | 19.6 |

Various heat sinks are prepared, and are 50 millimeter in width, 3 millimeter in thickness and 75 millimeter in length. Each of the heat sinks is formed of aluminum or aluminum alloy. The aluminum alloys used for the heat sink are selected from 1) Al-2.5% Mg-0.2% chromium alloy (abbreviated as "Al-Mg-Cr")
2) Al-1% manganese alloy (abbreviated as "Al-Mn")
3) Al-0.005% boron alloy (abbreviated as "Al-B")
4) Al-0.005% boron alloy (abbreviated as "Al-B")

Metallic islands are further prepared, and measure 45 millimeter in width, 1 millimeter in thickness and 70 millimeter in length. Each of the metallic islands is formed of the aluminum or the aluminum alloy listed hereinbefore. In order to braze the heat sink and the metallic island to the ceramic plates, various brazing alloy foils are further prepared, and are 50 microns in thickness. Each of the brazing foil is selected from 1) Al-13% silicon alloy
2) Al-7.5% silicon alloy
3) Al-15% germanium alloy Brazing alloy clads are also used for the ceramic substrates, and each of the brazing alloy clad is selected from 4) Al-9.5% Si-1% magnesium alloy (abbreviated as "Al-Si-Mg")
5) Al-7.5% Si- 10% germanium alloy (abbreviated as "Al-Si-Ge")

The brazing alloys are laminated on the heat sinks and the metallic islands through a rolling process, thereby forming brazing plates. The clads on the brazing plates are about 30 microns in thickness.

Using the brazing alloy foil or the brazing clad, each of the heat sink and the metallic island is brazed to the ceramic plate. The combinations are described in Table 2. In detail, the ceramic plates, the metallic islands and the metallic heat sinks accompanied with the brazing alloy blocks are stacked in such a manner as to be shown in FIG. 2, and are brazed in vacuum at 430 degrees to 610 degrees in centigrade for ten minutes. The ceramic structures thus fabricated are, then, kept at 350 degrees in centigrade for thirty minutes, and are cooled down to room temperature through furnace cooling. The surface of each metallic island is overlain by a copper film or a nickel film which is formed through an electroless plating process. In this instance, the copper or nickel film is of the order of 0.5 micron.

The prior art ceramic plate of aluminum oxide is sandwiched between oxygen free copper plates each measuring 45 millimeter in width, 0.3 millimeter in thickness and 70 millimeter in length. The ceramic plate thus sandwiched between the oxygen free copper plates is placed in an argon ambience containing oxygen of 1 volume % at 1075 degrees in centigrade for 50 minutes, then a copper-and-copper oxide eutectic phenomenon takes place, thereby allowing the oxygen free copper plates to bond to the ceramic plate of aluminum oxide. Using a foil-shaped brazer of Pb-60% Sn alloy with a thickness of 300 microns, a heat sink of oxygen free copper is soldered to one of the oxygen free copper plates bonded to the ceramic plate, and the heat sink is 50 millimeter in width, 3 millimeter in thickness and 75 millimeter in length.

TABLE 2

| Specimen | Heat sink | Metallic Island | Form | Solder Alloy |
|---|---|---|---|---|
| 1 | Al—Mn | Al | Foil | Al—7.5 Si |
| 2 | Al | Al—Mn | " | Al—Ge |
| 3 | Al—Mg—Cr | Al | Clad | Al—Si—Mg |
| 4 | Al | Al | Foil | Al—13 Si |
| 5 | Al—Ni | Al—Ni | " | Al—15 Si |
| 6 | Al | Al—Ni | Clad | Al—Si—Mg |
| 7 | Al—B | Al—B | Clad | Al—Si—Ge |
| 8 | Al | Al—Mn | Foil | Al—7.5 Si |
| 9 | Al | Al | Clad | Al—Si—Mg |
| 10 | Al—Mg—Cr | Al—Mn | Foil | Al—7.5 Si |
| 11 | Al—Mn | Al—Mn | Clad | Al—Si—Ge |
| 12 | Al—B | Al—B | Foil | Al—7.5 Si |
| 13 | Al | Al | Clad | Al—Si—Ge |
| 14 | Al | Al—Mn | Foil | Al—13 Si |
| 15 | Al—Mg—Cr | Al | " | Al—Ge |
| 16 | Al—Ni | Al | Clad | Al—Si—Mg |
| 17 | Al—B | Al—B | Foil | Al—7.5 Si |
| 18 | Al—Ni | Al—Ni | Foil | Al—7.5 Si |
| 19 | Al | Al | " | Al—Ge |
| 20 | Al—Mn | Al—Mn | " | Al—15 Si |
| 21 | Al | " | Clad | Al—Si—Mg |
| 22 | Al—Mg—Cr | " | Foil | Al—Ge |

Specimens 1 to 22 and the prior art ceramic substrate are subjected to heat cycle between 125 degrees in centigrade and −55 degrees in centigrade for evaluation, and the heat cycle is repeated twenty times. After the twenty heat cycles, specimens 1 to 22 and the prior art ceramic substrate are observed to see whether or not any crack takes place. If not, the specimens are subjected to the heat cycles twenty times again. Heat conductivity is measured for each specimen as well as the prior art ceramic substrate through a laser flashing method, and a bonding strength is further measured as shown in Table 3. Assuming that the prior art ceramic substrate has a unit weight "1", the weight ratio is calculated for each specimen. The measurement is also described in Table 3.

TABLE 3

| Specimen | The number of heat cycles | Heat conductivity (w/meter deg. in Kvn) | Bonding strength (Kg/mm$^2$) | Weight ratio |
|---|---|---|---|---|
| 1 | 200 without crack | 149 | more than 2 | 0.353 |
| 2 | " | 143 | " | 0.352 |
| 3 | " | 136 | " | 0.353 |
| 4 | " | 159 | " | 0.352 |
| 5 | " | 159 | " | 0.354 |
| 6 | " | 152 | " | 0.353 |
| 7 | " | 157 | " | 0.354 |
| 8 | " | 150 | " | 0.352 |
| 9 | 200 without crack | 159 | more than 2 | 0.352 |
| 10 | " | 138 | " | 0.354 |
| 11 | " | 136 | " | 0.353 |
| 12 | " | 159 | " | 0.354 |
| 13 | " | 158 | " | 0.352 |
| 14 | " | 158 | " | 0.352 |
| 15 | " | 144 | " | 0.353 |
| 16 | " | 152 | " | 0.353 |
| 17 | " | 159 | " | 0.354 |
| 18 | " | 159 | " | 0.354 |
| 19 | " | 158 | " | 0.352 |
| 20 | " | 147 | " | 0.354 |
| 21 | " | 148 | " | 0.352 |
| 22 | " | 138 | " | 0.354 |
| Prior-art | 20 with cracks | 160 | " | 1 |

As will be understood from Table 3, the prior art ceramic substrate was cracked due to a large difference in thermal expansion coefficient between aluminum oxide and copper, however, a light ceramic substrate resistive against the heat cycle is obtained without sacrifice of heat conductivity according to the present invention. This is because of the fact that the brazing alloy blocks take up thermal stress due to the difference in thermal expansion coefficient.

Second Embodiment

Figure 3:
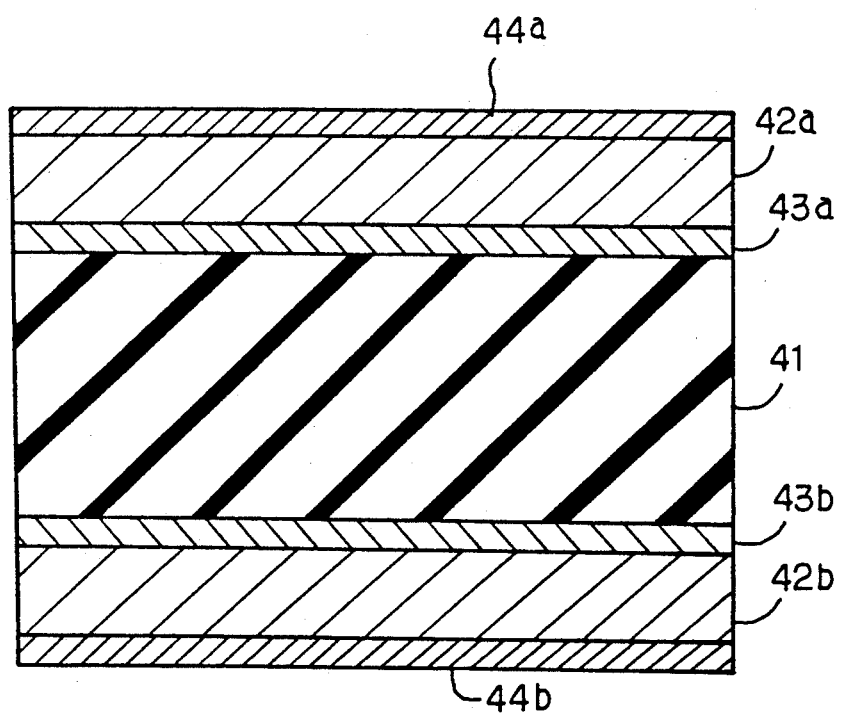
FIG. 3 is a cross sectional view showing the structure of another ceramic substrate according to the present invention.

Turning to FIG. 3 of the drawings, another ceramic substrate according to the present invention comprises a ceramic plate 41 of silicon carbide (SiC), and metallic plates 42a and 42b are brazed to both surfaces of the ceramic plate 41, respectively. For the ceramic plate 41 powder of silicon carbide is prepared, and is sintered in a high temperature ambience. In this instance, an aluminum-silicon alloy is used for the brazing, and the brazing films are designated by reference numerals 43a and 43b. However, an aluminum-germanium alloy or an aluminum-copper alloy are available for the brazing. The metallic plates 42a and 42b are respectively covered with nickel films 44a and 44b, and the nickel films 44a and 44b are replaceable with copper films, respectively. In this instance, the nickel films 44a and 44b are formed through plating technique. The metallic plates 42a and 42b are provided for electronic or electric components (now shown) and/or serve as a base plate. In this instance, the metallic plates 42a and 42b are formed of aluminum, and range from 0.2 millimeter to 0.4 millimeter. However, the aluminum plates 42a and 42b are replaceable with aluminum alloy plates, and the aluminum alloy may be selected from aluminum-manganese, aluminum-nickel and aluminum-boron. In this instance, the metallic plates 42a and 42b are brazed to both surfaces of the ceramic plate 41, and the ceramic substrate is less deformable, because thermal stress exerted on one surface of the ceramic plate 41 is canceled by thermal stress exerted on the other surface.

Silicon carbide is so adhesive to the brazing alloy of the Al-Si system that the metallic plates 42a and 42b hardly peel off. Since silicon carbide is larger in heat conductivity than aluminum oxide, a large amount of heat radiation and strong adhesion are achieved by the ceramic substrate shown in FIG. 3. The heat conductivity of silicon carbide is as large as 35 watt/mK to 270 watt/mK, and the heat conductivity of aluminum oxide ranges from 15 watt/ mK to 20 watt/mK.

The density of aluminum is as small as 2.7 to 2.8 gram/cm$^3$, however, copper is 8.9 to 9.0 gram/cm$^3$ in density. A light ceramic substrate is obtained by using the aluminum plates 42a and 42b.

The brazing films 43a and 43b are deformative enough to take up difference in thermal expansion coefficient between the silicon carbide and the aluminum. For this reason, the ceramic substrate according to the present invention can well withstand against thermal stress due to heat cycle.

Third Embodiment

Figure 4:
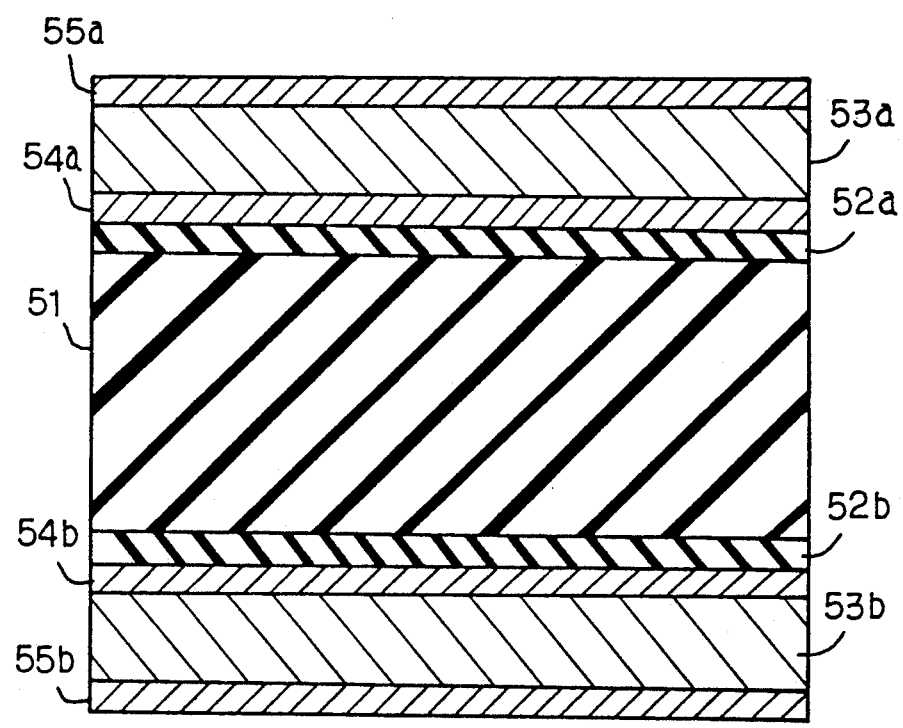
FIG. 4 is a cross sectional view showing the structure of still another ceramic substrate according to the present invention.

Turning to FIG. 4 of the drawings, another ceramic substrate embodying the present invention comprises a ceramic plate 51 of aluminum nitride, ceramic plates 52a and 52b of silicon carbide provided on both surfaces of the ceramic plate 51, metallic plates 53a and 53b of aluminum respectively brazed to the ceramic plates 52a and 52b with brazing alloy films 54a and 54b, and nickel films 55a and 55b covering the metallic plates 53a and 53b, respectively. The nickel films 55a and 55b are replaceable with copper films, and the metallic plates 53a and 53b may be formed of an aluminum alloy such as, for example, an aluminum manganese, an aluminum nickel or an aluminum boron alloy. Electric or electronic circuit components (not shown) are provided on at least one nickel film 55a or 55b, and a heat sink may be bonded to the other of the nickel films 55a and 55b. The brazing alloy films 54a and 54b are formed of a substance selected from an aluminum-silicon alloy, an aluminum-germanium alloy and aluminum-copper alloy.

Aluminum nitride has heat conductivity ranging from 50 watt/ mK to 270 watt/ mK, and silicon carbide is as large in heat conductivity as 35 to 270 watt/ mK. These substances are larger in heat conductivity than aluminum oxide the heat conductivity of which is as small as 15 to 20 watt /mK. Thus, the ceramic substrate shown in FIG. 4 is fabricated from the high-heat conductive plates, and, for this reason, the ceramic substrate can radiate a large amount of heat due to the electric or electronic circuit.

Silicon carbide is affinitive to aluminum silicon alloy, and the brazing alloy films 54a and 54b are perfectly brazed to the ceramic plate 51. Moreover, the aluminum nitride is smaller in dielectric constant than silicon carbide, and the ceramic substrate shown in FIG. 9 is improved in high-frequency characteristics rather than the ceramic substrate shown in FIG. 3.

The density of aluminum is as small as 2.7 to 2.8 gram/cm$^3$, however, copper is 8.9 to 9.0 gram/ cm$^3$ in density. The ceramic substrate shown in FIG. 4 is lighter than the prior art ceramic substrate using copper. The brazing films 54a and 54b are deformative enough to take up difference in thermal expansion coefficient between the silicon carbide and the aluminum. For this reason, the ceramic substrate according to the present invention can well withstand against thermal stress due to heat cycle.

Figure 5:
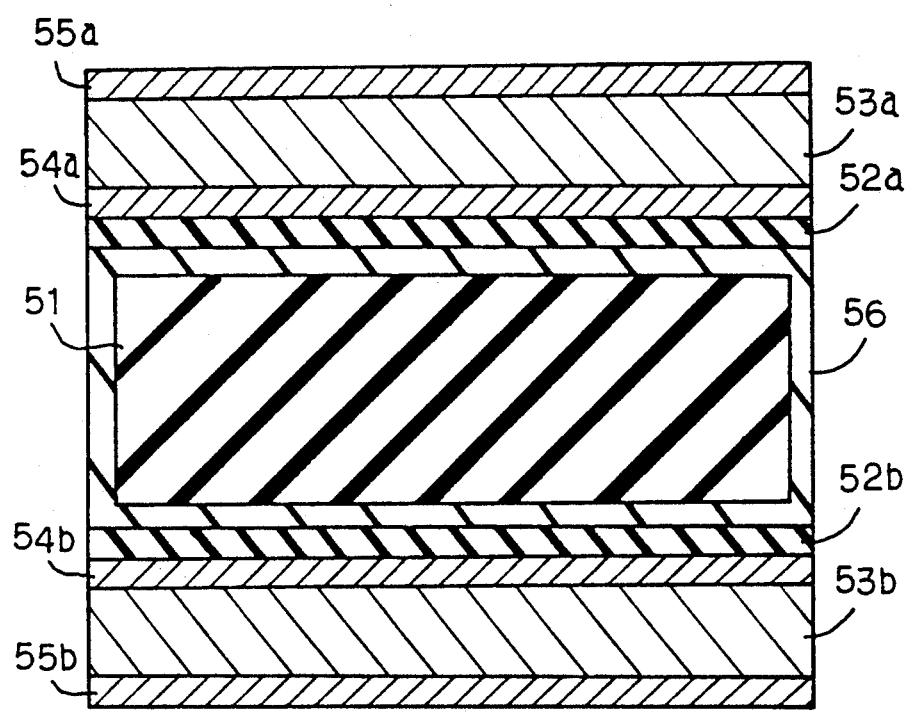
FIG. 5 is a cross sectional view showing the structure of a modification of the ceramic substrate shown in FIG. 4.
Figure 6C:
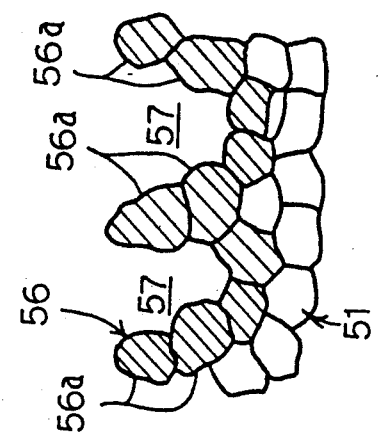
FIGS. 6A to 6C are views showing grains of aluminum nitride forming a surface portion of a ceramic plate of the ceramic substrate shown in FIG. 5.
Figure 6B:
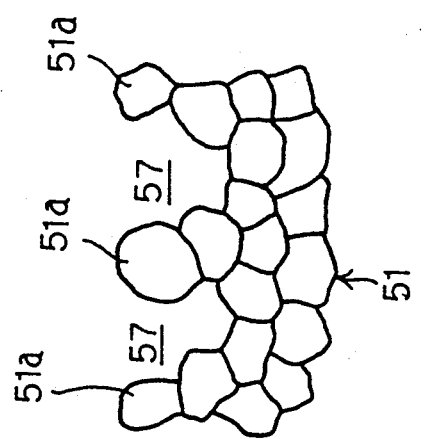
Figure 6A:
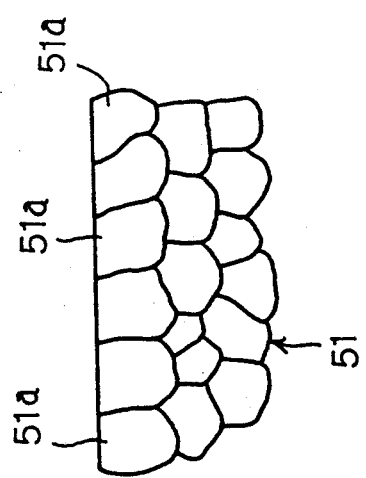

FIG. 5 shows a modification of the ceramic substrate shown in FIG. 4, and the same references designate component layers and films corresponding to those of the ceramic substrate shown in FIG. 4. In the modification, the surface of the ceramic plate 51 of aluminum nitride is eroded by acid solution or alkaline solution for forming a rough surface, and the rough surface is oxidized in a high-temperature oxidation ambience. The aluminum oxide film ranges from 0.05 micron to 30 microns. In the roughening process, the original surface of the ceramic plate 51 shown in FIG. 6A is attacked by the acid solution or the alkaline solution, and small recesses 57 take place in the rough surface as will be seen from FIG. 6B. The recesses 57 penetrate ½ time to 3 times larger than the grain 51a. After the oxidation, grains 56a, which are hatched in FIG. 6C, are oxidized in the high-temperature oxidation ambience, and the oxidized grains 56a form the aluminum oxide film 56.

Silicon carbide is deposited on the aluminum oxide film 56 by using a sputtering or a chemical vapor deposition, and the ceramic plates 54a and 54b strongly adhere to the aluminum oxide film 56 by virtue of the rough surface. If the recesses 57 are shallower than a half of the grain size, the increment of surface area due to the roughening is too small to increase the adhesion. If the recesses 57 exceed the critical value three time larger than the grain size, spike-like grain clods tends to be crashed due to erosion of the grain boundaries, and the adhesion between the aluminum oxide film 56 and the ceramic plates 52a and 52b is decreased.

The thickness of the aluminum oxide film 56 deeply concerns the adhesion as well as the heat radiation. If the aluminum oxide film 56 is less than 0.05 micron, non-oxidized surface is exposed to the boundary between the aluminum oxide film 56 and the ceramic plates 52a and 52b, and decreases the adhesion. The aluminum oxide film 56 greater than 30 microns deteriorates the heat conduction characteristics of the ceramic substrate, because the aluminum oxide is smaller in heat conductivity than the aluminum nitride and the silicon carbide.

Although particular embodiments of the present invention have been shown and described, it will be obvious to those skilled in the art that various changes and modifications may be made without departing from the spirit and scope of the present invention. For example, another aluminum alloy may be available for the metallic heat sink 14 and the conductive metallic islands 12 and 13 in so far as the aluminum alloy is larger in the fatigue limit against a repeated load than copper and smaller in the specific weight than copper. The candidates are an Al-B alloy, an Al-Bi alloy, an Al-Ca alloy, an Al-Cd alloy, an Al-Ce alloy, an Al-Cr alloy, an Al-Cu alloy, an Al-Fe alloy, an Al-Ga alloy, an Al-In alloy, an Al-La alloy, an Al-Li alloy, an Al-Mn alloy, an Al-Mg alloy, an Al-Mo alloy, an Al-Nb alloy, an Al-Ni alloy, an Al-Pb alloy, an Al-Pd alloy, an Al-Pt alloy, an Al-Sb alloy, an Al-Si alloy, an Al-Ti alloy, an Al-Sn alloy, an Al-V alloy, an Al-W alloy, an Al-Y alloy, an Al-Zn alloy and an Al-Ze alloy. Moreover, all of the embodiments are equipped with the heat sinks. However, another ceramic substrate according to the present invention may not be equipped with any heat sink.

What is claimed is:

1. A ceramic substrate used for an electric or electronic circuit comprising
 a) a ceramic foundation, and
 b) conductive island means comprised of aluminum or an aluminum alloy bonded to one surface of said ceramic foundation, said conductive island means providing a conductive path for at least one circuit component connected thereto, in which said conductive island means is brazed to said one surface of said ceramic foundation with a brazing alloy selected from the group consisting of an aluminum-silicon alloy, an aluminum-germanium alloy, an aluminum-silicon-magnesium alloy and an aluminum-silicon-germanium alloy.

2. A ceramic substrate as set forth in claim 1, in which said ceramic foundation comprises a ceramic plate essentially composed of aluminum nitride covered with an aluminum oxide film, said aluminum oxide film ranging from about 0.2 micron to about 20 microns.

3. A ceramic substrate as set forth in claim 2, in which said aluminum nitride contains at least one kind of sintering aids selected from the group consisting of yttrium oxide and calcium oxide, said sintering aids ranging from about 0.1% to about 10% by weight.

4. A ceramic substrate as set forth in claim 1, in which said ceramic foundation comprises a ceramic plate essentially composed of silicon carbide.

5. A ceramic substrate as set forth in claim 1, in which said ceramic foundation comprises a combination of a first plate essentially composed of aluminum nitride and a second plate essentially composed of silicon carbide.

6. A ceramic substrate as set forth in claim 5, in which said first plate has a first oxidized rough surface where said second plate is deposited.

7. A ceramic substrate as set forth in claim 6, in which said ceramic substrate further comprises a third plate essentially composed of silicon carbide and deposited on a second oxidized rough surface opposite to said first oxidized rough surface, and another metallic island brazed to said third plate with said brazing alloy.

8. A ceramic substrate used for an electric or electronic circuit comprising
a) a ceramic foundation essentially composed of aluminum nitride, said ceramic foundation being covered with an aluminum oxide film ranging from about 0.2 micron to about 20 microns, and
b) conductive island means comprised of aluminum or an aluminum alloy bonded to one surface of said ceramic foundation, said conductive island means providing a conductive path for at least one circuit component connected thereto, in which said conductive island means is brazed to said one surface of said ceramic foundation with a brazing alloy selected from the group consisting of an aluminum-silicon alloy, an aluminum-germanium alloy, an aluminum-silicon-magnesium alloy and an aluminum-silicon-germanium alloy, said aluminum-silicon alloy containing aluminum in an amount ranging from about 7.5% to about 15% by weight, said aluminum-germanium alloy containing aluminum in an amount of about 15% by weight, said aluminum-silicon-magnesium alloy containing aluminum in an amount of about 9.5% by weight and containing silicon in an amount of about 1% by weight, said aluminum-silicon-germanium alloy containing aluminum in an amount of about 7.5% by weight and silicon in an amount of about 10% by weight.

9. A ceramic substrate used for an electric or electronic circuit comprising
a) a ceramic foundation essentially composed of silicon carbide, and
b) conductive island means comprised of aluminum or aluminum alloy bonded to one surface of said ceramic foundation, said island means providing a conductive path for at least one circuit component connected thereto, in which said conductive island means is brazed to said one surface of said ceramic foundation with a brazing alloy selected from the group consisting of an aluminum-silicon alloy, an aluminum-germanium alloy and an aluminum-copper alloy.

* * * * *